United States Patent [19]
Knoch

[11] Patent Number: 6,065,144
[45] Date of Patent: May 16, 2000

[54] TESTING UNIT WITH TESTING INFORMATION DIVIDED INTO REDUNDANCY-FREE INFORMATION AND REDUNDANCY INFORMATION

[75] Inventor: Ulrich Knoch, Boeblingen, Germany

[73] Assignee: Hewlett-Packard Company, Palo Alto, Calif.

[21] Appl. No.: 09/042,442

[22] Filed: Mar. 13, 1998

[30] Foreign Application Priority Data

May 22, 1997 [EP] European Pat. Off. .............. 97108300

[51] Int. Cl.⁷ ................................................... G01R 31/28
[52] U.S. Cl. ........................................... 714/724; 714/738
[58] Field of Search ................................... 714/724, 728, 714/735–738

[56] References Cited

U.S. PATENT DOCUMENTS

| | | | |
|---|---|---|---|
| 4,652,814 | 3/1987 | Groves et al. | 714/738 |
| 5,157,664 | 10/1992 | Waite | 714/710 |
| 5,317,573 | 5/1994 | Bula et al. | 714/711 |
| 5,321,701 | 6/1994 | Raymond et al. | 714/736 |

FOREIGN PATENT DOCUMENTS

| | | |
|---|---|---|
| 0204130A2 | 12/1986 | European Pat. Off. . |
| 2074820A | 4/1980 | United Kingdom . |
| WO 90/08964 | 8/1990 | WIPO . |

*Primary Examiner*—Emmanuel L. Moise

[57] ABSTRACT

A circuit for applying a testing data to a DUT for testing the DUT comprises a buffer memory for receiving and buffering a redundancy-free information as information which is substantially free of redundancy but might also comprise some redundant information to a certain extent, a redundancy memory for storing a redundancy information as information comprising a certain amount of redundancy, and a processing unit for generating the testing data by processing the redundancy-free information in association with the redundancy information. Further, includes a method for applying a testing data to the DUT for testing the DUT includes the steps of receiving and buffering the redundancy-free information, fetching in accordance with the received redundancy-free information the redundancy information, and generating the testing data by processing the redundancy-free information in association with the redundancy information.

4 Claims, 5 Drawing Sheets

TESTING UNIT WITH TESTING INFORMATION DIVIDED INTO REDUNDANCY-FREE INFORMATION AND REDUNDANCY INFORMATION

BACKGROUND OF THE INVENTION

The present invention generally relates to the application of a testing data to a device for testing the device.

In most applications, integrated circuits (IC's) or other electronic devices are tested after production and before use. FIG. 1 shows a schematic diagram of a typical testing unit 10. The testing unit 10 comprises a tester 20 and a device under test (DUT) 30, which can be an IC or any other electronic device. The tester 20 comprises a signal generating unit 40, a signal receiving unit 50, and a signal analyzing unit 60.

The DUT 30 receives a DUT input signal on a line 70 from the signal generating unit 40 of the tester 20, processes those signals, and generates a DUT output signal, which again, is received by the signal receiving unit 50 of the tester 20 via a line 80. The signal analyzing unit 60 receives the DUT input signal, or a corresponding signal derived therefrom, on a line 90 from the signal generating unit 40, and the DUT output signal, or a corresponding signal derived therefrom, on a line 95 from the signal receiving unit 50. The signal analyzing unit 60 analyses those signals, e.g. by comparing the signals. The tester 20 can thus draw conclusions about the properties and quality of the DUT 30.

It is to be understood that for the sake of simplicity, the term 'line' as used herein refers to any kind of physical connection. In several applications, the line will be implemented by more or less complex data busses.

The DUT input signal and the DUT output signal are also called vector data and comprise one or more single individual vectors. Each individual vector represents a signal state which is either to be applied at the input of the DUT 30 or output by the DUT 30 at a given point in time.

There are several testing methods known in the art to apply test data to the DUT 30. In a so called 'parallel test', the DUT input data is applied at the inputs of the DUT 30 and the outputs thereof are observed. During a SCAN test, states internal of the DUT 30 can be changed or monitored directly. DUTs 30 that allow SCAN test need special storage devices which can be written in a serial fashion. They can also be read serially. These special storage devices need more silicon area than normal storage devices (flip-flops). In order to reduce the additionally required area boundary SCAN is often implemented. Boundary SCAN devices only have writeable flip-flops at the inputs and outputs of the device, Boundary SCAN test is often used during a board test to directly change and monitor certain states at the boundaries of the DUTs 30 on a board.

In several applications, the signal analyzing unit 60 receives an expected DUT output signal from the signal generating unit 40 and compares that signal with the actual DUT output signal received by the signal receiving unit 50. The expected DUT output signal represents the signal which is expected as DUT output signal in case the DUT 30 is working in the expected way. During the testing, the actually received DUT output signal is compared, e.g. continuously, with the expected DUT output signal. If the signals do not match, the DUT has a functional failure and the test fails.

FIG. 2 shows a typical circuit for the generation of the DUT input signal as known in the art. The DUT input signal is generated under control of a vector processor 100. Similar to the processing of a program by a microprocessor, the vector processor 100 processes a sequence of commands, whereby on demand, data stored in a vector memory 110 can be fetched via a line 120 and might needs to be suitably formatted. Eventually, the DUT input signal is applied on line 70 to the DUT 30. The DUT input signal, or a signal derived therefrom comprising or representing the expected DUT output signals, is also applied on line 90.

The vector memory 110 stores vector data comprising one or more vector sequences which can be any kind of data to be applied to the DUT 30. In most cases, the vector memory 110 is implemented by a semiconductor memory, such as a random access memory (RAM), allowing to flexibly and quickly change the contents thereof. The vector data is stored in the vector memory 110 at defined addresses. When the vector processor 100 applies a respective address word on line 120 to the vector memory 110, vector data corresponding to that address will be available at an output of the vector memory 110 on line 120. This output vector data is further processed by the vector processor 100 and might serve as DUT input signal—or as expected DUT output signal—for testing the DUT 30.

The price of testers 20 strongly depends on the size of the needed memory for storing the testing data for the DUT 30. Particularly when expensive semiconductor memory is employed, it is highly desirable to reduce the memory size needed.

It is known in the art that the size of the vector memory 110 can be reduced by implementing suitable commands or instructions for the vector processor 100. It is made use of the fact that a stream of vector data for testing the DUT 30 might comprise one or more sequences of identical data. Each sequence of identical data is stored separately into the vector memory 110 and can be called up on demand by applying suitable commands. The effective size of the vector memory 110 can thus be reduced corresponding to the frequency of repeated sequences of identical data.

However, it has been found that this way to reduce the required size of the vector memory 110 also involves several disadvantages:

1. Storing of the suitable commands or instructions also requires a certain amount of memory area.
2. In case that several instructions reserve the physically identical part of the vector memory 110, the number of vector sequences storable into the vector memory 110 is limited by the number of instructions.
3. Also in case that several instructions reserve the physically identical part of the vector memory 110, instructions and vector sequences use the same memory and thus also have to use the same line, bus or data path. Therefore, instructions and vector sequences cannot be read (reading vector sequences from the memory by the vector processor 100 is generally called vector generation) from the memory at the same time and new vector data cannot be generated while a new instruction is read. This causes interruptions in the vector data stream which have to be avoided because the DUT 30 might behave differently, if the vector stream stops. A stop in the vector stream might cause temperature effects. In some cases (e.g., Phase Locked Loops—PLL—circuits, dynamic logic), the current state of the DUT 30 might be changed so that the DUT 30 might alter its states during the stop.
4. In case that instructions occupy another physical memory, additional costs arise for the additional memory.

5. A certain amount of repeated data sequences is required to achieve a significant improvement of the memory size.

SUMMARY OF THE INVENTION

It is an object of the invention to provide an improved testing unit with reduced memory size required.

According to the invention, a circuit for applying a testing data to a DUT for testing the DUT comprises a buffer memory for receiving and buffering a redundancy-free information as information which is substantially free of redundancy but might also comprise some redundant information to a certain extent, a redundancy memory for storing a redundancy information as information comprising a certain amount of redundancy, and a processing unit for generating the testing data by processing the redundancy-free information in association with the redundancy information.

The invention is preferably embodied in a tester for testing the DUT comprising a signal generating unit for generating a DUT input signal for testing the DUT, a signal receiving unit for receiving a DUT output signal from the DUT in reaction to the DUT input signal, and a signal analyzing unit for analyzing the DUT output signal in association with the DUT input signal, whereby the signal generating unit comprises the circuit for applying the testing data to a DUT.

The invention can also be applied as a method for applying the testing data to the DUT for testing the DUT. The method comprises the steps of receiving and buffering the redundancy-free information, fetching in accordance with the received redundancy-free information a redundancy information, stored in the redundancy memory, and generating the testing data by processing the redundancy-free information in association with the redundancy information.

According to one embodiment, the redundancy information comprises information about the contents of such testing data which identically occurs several times without changes, and the redundancy-free information comprises information about the contents of such testing data which does not identically occur several times and information about the application of the redundancy information.

According to another embodiment, the redundancy information comprises information about the contents of such testing data which occurs several times without substantial changes, and the redundancy-free information comprises information about the contents of such testing data which does not occur several times and information about the application of the redundancy information.

According to a further embodiment, the redundancy information comprises information about access protocols as used for accessing the respective DUT.

According to yet a further embodiment, the redundancy-free information comprises information about the test to be performed, which is substantially independent of the DUT to be tested, and the redundancy information comprises DUT specific data, that is information about the specific DUT to be tested.

The invention is preferably used in IC testers for testing integrated circuits.

BRIEF DESCRIPTION OF THE DRAWINGS

Other objects and many of the attendant advantages of the present invention will be readily appreciated and become better understood by reference to the following detailed description when considering in connection with the accompanied drawings, in which.

DETAILED DESCRIPTION OF THE INVENTION

Figure 3:
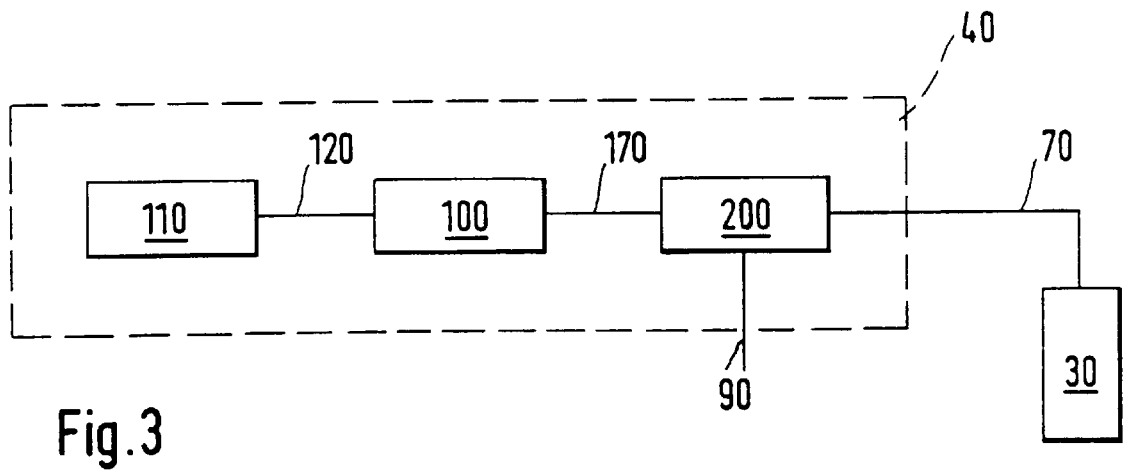
FIG. 3 shows a schematic diagram of an embodiment of a signal generating unit 40 according to the invention.

FIG. 3 shows a schematic diagram of an embodiment of a signal generating unit 40 according to the invention. The signal generating unit 40 comprises the vector processor 100 connected to the vector memory 110 via line 120. Furthermore, the signal generating unit 40 is connected via a line 170 to a decompression circuit 200, which again is connected via line 70 to the DUT 30 and line 90 to the signal analyzing circuit 60.

Figure 1:
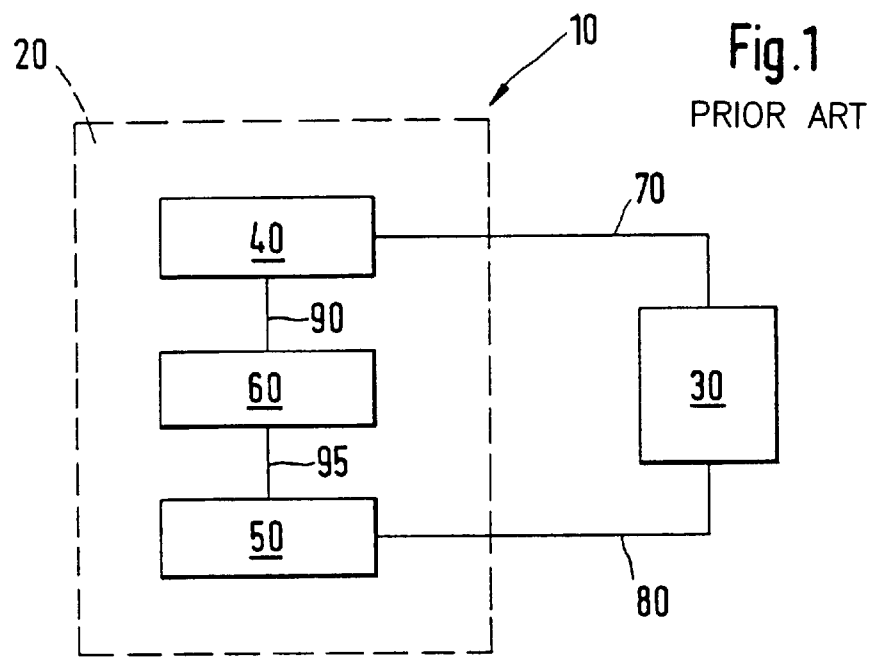
FIG. 1 shows a schematic diagram of a typical testing unit 10.
Figure 2:
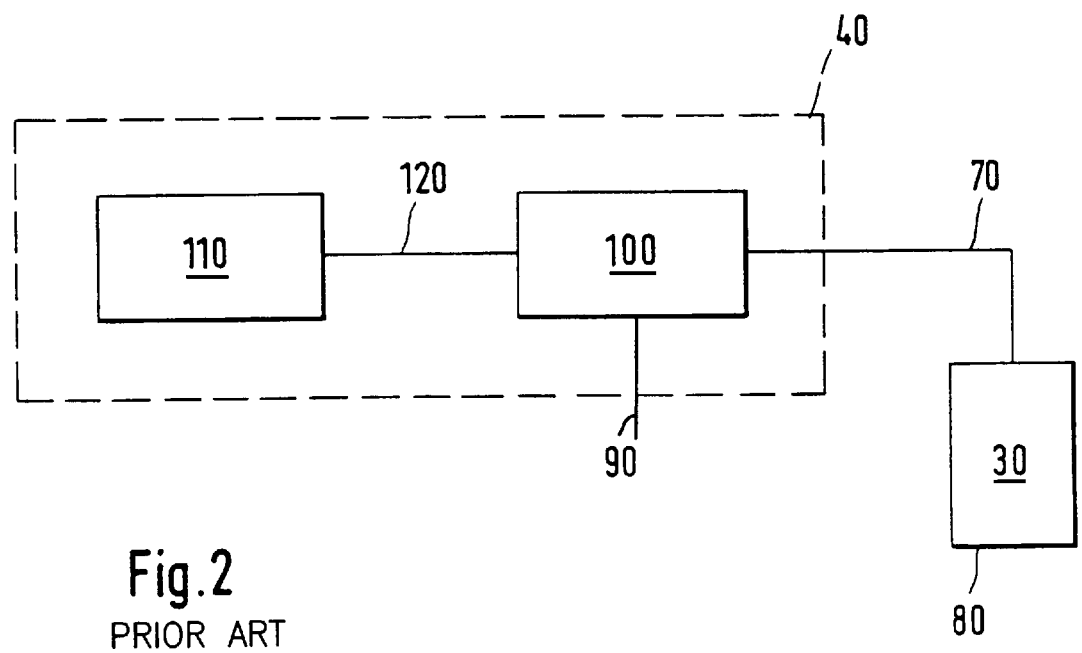
FIG. 2 shows a typical circuit for the generation of the DUT input signal as known in the art.

It is to be understood that the vector processor 100 and the vector memory 110 as used in the embodiments according to the invention might be physically identical with the vector processor 100 and the vector memory 110 as used according to FIG. 2, however, fulfil different functions and are loaded with different data.

Figure 4:
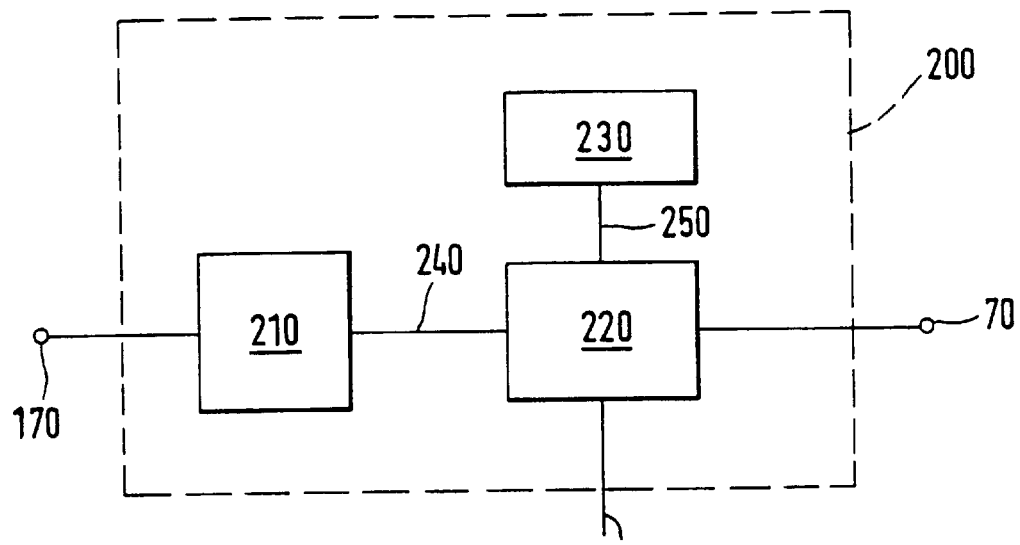
FIG. 4 shows a preferred embodiment of the decompression circuit 200.

FIG. 4 shows a preferred embodiment of the decompression circuit 200. The decompression circuit 200 comprises a buffer memory 210, a processing unit 220, and a redundancy memory 230. The buffer memory 210 has an input at line 170 and an output thereof is connected via a line 240 to the processing unit 220. The processing unit 220 again is coupled via a line 250 to the redundancy memory 230, via line 70 to the DUT 30, and via line 90 to the signal analyzing circuit 60. It is to be understood that the decompression circuit 200 according to the invention receives an input signal on line 170 which can be a signal either from the vector processor 100 or from any kind of source emitting suitable signals for the decompression circuit 200. The invention is therefore not limited to the usage of the vector processor 100 and the vector memory 110 for applying the input signal on line 170. Any source applying suitable input signals on line 170 may serve the purposes of the invention.

The invention makes use of the fact that any information required for testing the DUT 30 comprises redundancy information, which is information comprising a certain amount of redundancy, and redundancy-free information, which is information substantially free of redundancy but might also comprise some redundant information to a certain extent. The separation into redundancy information and redundancy-free information depends on the actual application and may not be perfectly accomplished in some cases.

Redundancy in the information needed for generating the vector data required for testing the DUT 30 can result, e.g., from repeating certain sequences of vector data without any changes, from repeating certain sequences of vector data with a certain amount of changes such as varying certain data, from using specified access protocols for accessing the DUT 30, and/or from dividing the information in test specific data and DUT specific data. In any case, information which is specific for one or more sequences of vector data, which represents only changes between one or more successive sequences of vector data, or which represents only test specific data or DUT specific data can be separated as redundancy-free information. Information which is not specific for that sequences of vector data, which is substantially not changed during successive sequences of vector data, or which does not represent only test specific data or DUT specific data can be separated as redundancy information.

The separation of information required for testing the DUT 30 into redundancy information and redundancy-free information can be accomplished, e.g. by analyzing-prepared-sequences of vector data to be applied to the DUT 30, or by dividing the information already during the generation of the vector data. In the former case, prepared sequences of vector data are analyzed, e.g. by comparing successive sequences of vector data, redundant information within the sequences is extracted as redundancy information, and the remaining data and additional information about the redundancy information within the sequences of vector data is defined as redundancy-free information. In the latter case, information about successive sequences of vector data, access protocols, and/or test specific data or DUT specific data must already be present during the generation of the vector data. The separating in both cases can be executed either manually or automatically by means of suitable tools, such as software programs. The separating may be executed 'on-line', i.e. just before applying the sequences of vector data to the DUT 30, or may be prepared before an application, e.g. as stored data files.

According to the invention, the redundancy information is stored into the redundancy memory 230, whereas the redundancy-free information is provided as input signal on line 170 for the decompression circuit 200. The redundancy-free information can e.g. be stored into the vector memory 110 or in other suitable memories.

In one embodiment, the redundancy information comprises information about the contents of such sequences of vector data which identically occur several times without changes. The redundancy-free information comprises information about the contents of such sequences of vector data which do not identically occur several times. The redundancy-free information further comprises information about the application of the redundancy information within the sequences of vector data to be applied to the DUT 30, e.g. information when and how often a certain sequence of vector data has to be repeated.

In another embodiment, the redundancy information comprises information about the contents of such sequences of vector data which occur several times without substantial changes. The redundancy-free information comprises information about the contents of such sequences of vector data which do not occur several times. The redundancy-free information further comprises information about the application of the redundancy information within the sequences of vector data to be applied to the DUT 30, e.g. information when and how often a certain sequence of vector data has to be repeated, and information representing the changes between such sequences of vector data which occur several times, however, with some changes.

In a further embodiment, it is made use of the fact that in most testing applications, more or less complex access protocols for accessing the DUT 30 are used. In that embodiment, the redundancy information mainly comprises information about the access protocols as used. The access protocols, e.g. read or write accesses, are specific and always the same for each DUT 30. For each access onto the DUT 30, a certain sequence of vector data is required. The access protocols normally require a sequence of certain defined signals, such as control signals, address signals, and data signals, which are to be applied to the DUT 30 over a certain number of tester cycles. The tester cycle is, in most cases, defined by a clock signal used for testing the DUT 30.

A specific access onto the DUT 30 requiring one or more specific sequences of vector data is called a specific device cycle. During a specific device cycle, the control signals, address signals, and data signals generally only vary little from the preceding vector data or sequence thereof to the following.

Figure 5:
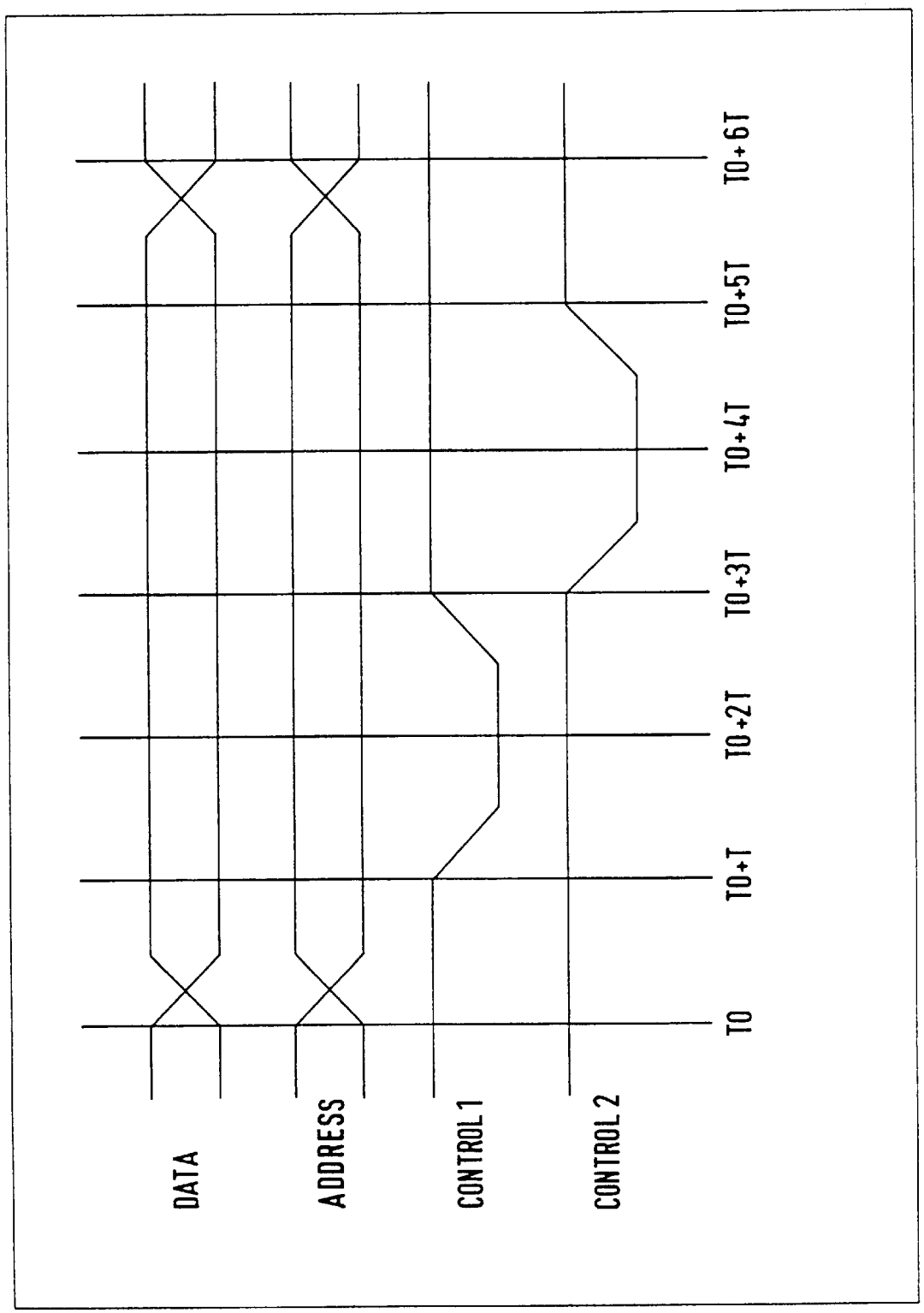
FIG. 5 shows an example for a specific device cycle.

FIG. 5 shows an example for a specific device cycle. It can be seen, that a signal CONTROL 1 and a signal CONTROL 2 follow a fixed scheme determined by the respective access protocol. A signal DATA and a signal ADDRESS which can be set at a time T0 might first be changed at a time T0+6T. The device cycle as shown in FIG. 5 from T0 to T0+6T has a length of 6T. The shape of the signals CONTROL 1 and CONTROL 2 is not dependent on the respective signals DATA and ADDRESS during that device cycle. Within that specific device cycle, only the DATA and ADDRESS signals contain information free of redundancy, or said in other words, information that is not covered by the access protocol.

In a further embodiment, the separation of the vector data is accomplished by providing information about the test to be performed, which is independent of the actual DUT 30 to be tested, as the redundancy-free information. The redundancy information, in contrast thereto, comprises DUT specific data, that is information about the specific DUT 30 to be tested. This allows to use the same test specific data for a plurality of different DUTs 30, or accordingly, to use the same DUT specific data for a plurality of different tests. The redundancy-free information which provides the test specific data might be stored into the vector memory 110, and the redundancy information which provides the DUT specific data is stored in the redundancy memory 230. The redundancy memory 230 with the stored DUT specific data behaves like a DUT specific 'dictionary' which is used by the processing unit 220 for 'translating' the test specific information into the required vector data for actually testing the DUT 30.

It is to be understood that the possibilities to divide the information into redundancy information and redundancy-free information can be combined and are not limited to the given embodiments.

The invention allows to reduce the size of the vector memory 110 by a factor dependent on the proportion of the redundancy-free information to the redundancy information within the vector data. The additional memory size required for the redundancy memory 230 also depends on the amount of redundancy information, e.g. determined by the used access protocol. The memory size for the vector memory 110 and the redundancy memory 230 in total will be, in most cases, much smaller than the memory size required for the vector memory in the art.

The buffer memory 210 receives the redundancy-free information on its input on line 170, e.g. from the vector processor 100. The redundancy-free information contains information about sequences of vector data which are to be applied as the vector data stream to the DUT 30 and to the signal analyzing unit 60. The processing unit 220 reads the redundancy-free information buffered in the buffer memory 210 and generates the sequences of vector data corresponding thereto. The processing unit 220 combines the redundancy-free information with redundancy information stored in the redundancy memory 230, corresponding to the respective redundancy-free information. The processing unit 220 further assembles the read out sequences of vector data to a vector data stream. The vector data stream is applied by the processing unit 220 as DUT input signal on line 70 to the DUT 30. The processing unit 220 also applies the vector data stream on line 90 to the signal analyzing unit 60, either directly as the DUT input signal or as a signal corresponding to the DUT input signal, e.g. as the expected DUT output signal.

In case that the redundancy information comprises information about the access protocols, the redundancy-free information may comprise so-called device cycle codes representing the information about sequences of vector data which are to be applied as the vector data stream to the DUT 30 and to the signal analyzing unit 60. The processing unit 220 reads the device cycle codes buffered in the buffer memory 210 and generates the sequences of vector data. Corresponding to the respective device cycle codes, the processing unit 220 combines redundancy-free information within the device cycle code with redundancy information stored in the redundancy memory 230, and assembles the read out sequences of vector data to the vector data stream.

The redundancy memory 230 contains a certain number of entries. Each entry at least comprises a description of a respective vector sequence and the coded length of the vector sequence. The entries can be dynamically stored within the redundancy memory 230, so that the entries can even be changed during a running test. Preferably, the redundancy memory 230 is implemented as a semiconductor memory such as a RAM.

Due to the separation into redundancy information and redundancy-free information, the data rate—that is the number of information per time unit—might differ from line 170 to the lines 70 and 90. On line 170, only the redundancy-free information is applied, whereas on lines 70 and 90 the processing unit 220 applies the vector data comprising as well the redundancy-free information as the redundancy information.

The DUT input signal on line 70 applied to the DUT 30 needs to be at a constant data rate. The vector stream must be without breaks and 'hiccups', because the DUT 30 might behave differently otherwise (e.g., thermally or dynamically different, PLL state changes). 'Differently' means that there might be a difference between a simulation and a test. Often a simulation constitutes the source for the vector data to be applied to the DUT 30. Since testing involves very complex processes and occurrences, it is generally tried to minimize possible unknown effects. The sequences of vector data read out from the redundancy memory 230 might differ in length and number from one redundancy-free information applied to the buffer memory 210 to the next, so that also the data rate on lines 70 and 90 might differ.

The processing unit 220 preferably reads out the buffer memory 210 when new valid redundancy-free information appears and generates thereof the corresponding vector data. The content and the length of the generated vector data have to be definitely determined by the respective redundancy-free information.

In order to control the data rate of the vector data on lines 70 and 90, the processing unit 220 controls the data rate on line 240, or in other words, the rate for reading out the buffer memory 210. This is preferably accomplished by a control signal applied from the processing unit 220 on line 240 to the buffer memory 210. The buffer memory 210 in combination with the processing unit 220 thus buffers the different data rates between line 170 and lines 70 and 90. In some cases, the buffer memory 210 might also be incorporated into the processing unit 220.

The invention allows to reduce the memory size required for applying the vector data. Or, in other words, with a given memory size, more vectors can be virtually stored.

The invention also allows to decode data vectors received on line 170 to different data vectors to be applied on lines 70 and/or 90 by means of the redundancy memory 230, whereby the redundancy memory 230 serves as a decoding dictionary.

Figure 6:
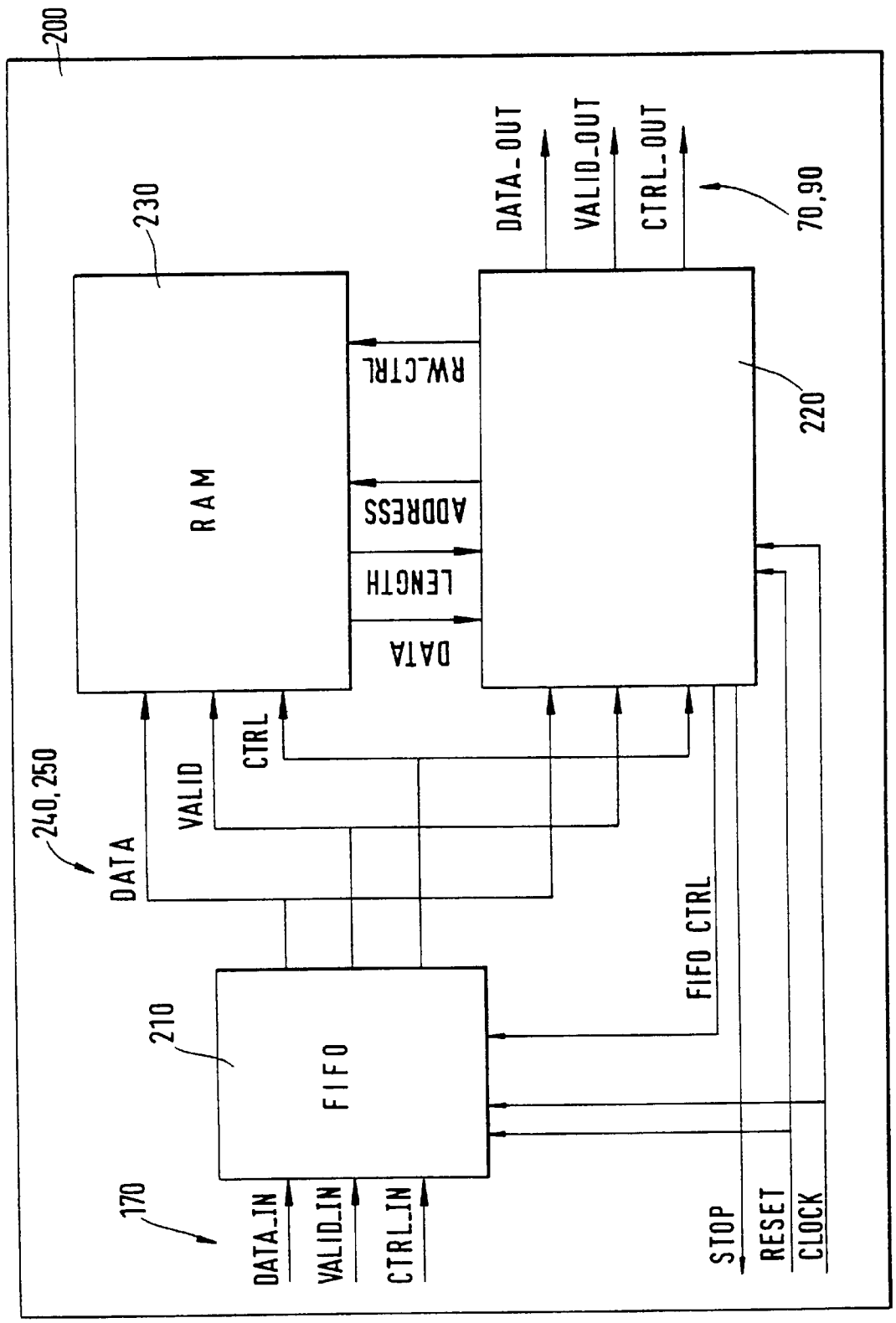
FIG. 6 shows a preferred embodiment of the decompression circuit 200.

FIG. 6 shows a preferred embodiment of the decompression circuit 200. The decompression circuit 200 is implemented as a part of a CMOS VLSI circuit, wherein the buffer memory 210 is implemented as a FIFO (first in first out) memory and the redundancy memory 230 as a RAM. The decompression circuit 200 is clock-driven and each code word used within the decompression circuit 200 or applied thereto may be represented by a six bit word.

On line 170, which is implemented as a data bus, the buffer memory 210 receives a data signal DATA_IN, a validation signal VALID_IN, and a control signal CTRL_IN. Lines 240 and 250 are implemented as a joint data bus also comprising a data line DATA, a validation line VALID, and a control line CTRL. A valid data word in the buffer memory 210 is indicated by the validation signal VALID. When the processing unit 220 finds a valid data word in the buffer memory 210, the processing unit 220 reads out the last stored data words in the buffer memory 210 via the data line DATA. Corresponding to the contents of the read out data word, the processing unit 220 fetches respective data vectors stored in the redundancy memory 230 by means of the control line CTRL and the data line DATA. This is indicated by the arrows between the processing unit 220 and the redundancy memory 230 showing the exchange of information between the processing unit 220 and the redundancy memory 230. The processing unit 220 signals an address signal ADDRESS and a read/write control signal RW_CTRL to the redundancy memory 230 and receives corresponding thereto the requested data DATA and the length LENGTH thereof from the redundancy memory 230.

The processing unit 220 assembles one or more data vectors based on the redundancy-free information, as provided by the current data word read out from the buffer memory 210, and based on the data fetched from the redundancy memory 230 in accordance with the current data word. The one or more data vectors are applied as a signal DATA_OUT on lines 70 and 90 which are embodied as a joint data bus. The data word read out from the buffer memory 210 might only comprise addresses of respective data vectors stored in the redundancy memory 230, causing the redundancy memory 230 to behave like a dictionary. However, the data word read out from the buffer memory 210 may also comprise additional data. The processing unit 220 assembles the data vectors to a substantially continuous vector data stream.

When the current data word in the buffer memory 210 has been worked off and in case a successive data word is valid in the buffer memory 210, the processing unit 220 reads out the successive data word and assembles respective data vectors in accordance with that newly read out data word. Further signal lines as shown in FIG. 6 such as a STOP signal, a RESET signal a CLOCK signal, a VALID_OUT signal, and a CTRL_OUT signal, are used in order to control the decompression circuit 200 and to communicate with other units.

Figure 7:
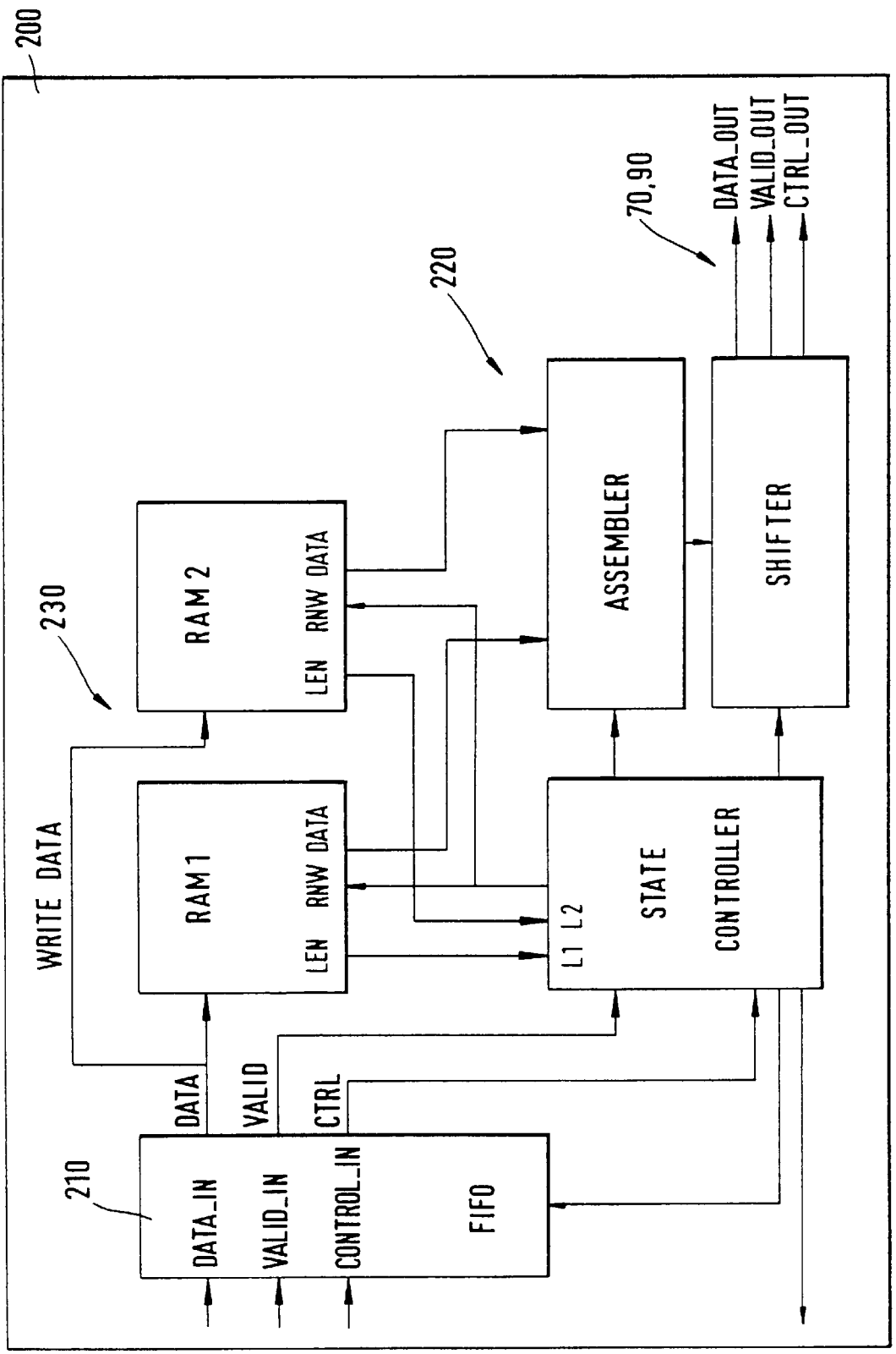
FIG. 7 shows the embodiment of FIG. 6 in more detail.

FIG. 7 shows the embodiment of FIG. 6 in more detail. For the sake of processing speed, the redundancy memory 230 comprises two RAM memories RAM1 and RAM2. Two data words stored in the buffer memory 210 are processed together in parallel. The processing unit 220 is embodied by a state controller for controlling the reading out of the buffer memory 210 and the fetching of data stored in RAM1 or RAM2 of the redundancy memory 230. An assembler within the processing unit 220 receives the read out data from the buffer memory 210 and the fetched data from the redundancy memory 230 and assembles thereof the corresponding data vectors. A shifter within the processing unit 220 matches possible delays of the data vectors applied on lines 70 and 90 with other external units.

When this state controller finds a valid data word in the buffer memory 210, the state controller controls the data fetching from RAM1 and RAM2 in accordance with the read out data word. The state controller controls the assembling of the data vectors by the assembler dependent on the length of the fetched data from the redundancy memory 230 provided as length information to the state controller. Dependent on the entire length of a sequence of data vectors generated according to a read out data word from the buffer memory 210, the state controller either stops or calls up a successive data word stored in the buffer memory 210.

What is claimed is:

1. A decompression circuit for applying testing data to a device under test (DUT) for testing the DUT, comprising:

a redundancy memory with a plurality of entries, each entry comprising a respective vector sequence and coded length of the vector sequence;

a buffer memory for receiving and buffering one or more data words, each comprising one or more addresses of entries stored in the redundancy memory;

a processing unit for generating testing data by processing respective vector sequences and coded lengths thereof retrieved from said redundancy memory, in association with the one or more data words received from the buffer memory, whereby the redundancy memory behaves like a dictionary.

2. The decompression circuit as recited in claim 1, wherein said processing unit modifies a retrieved vector sequence in accord with a received instruction.

3. A method for applying a testing data to a device under test (DUT) for testing the DUT, comprising the steps of:

receiving and buffering one or more data words, each comprising one or more addresses of entries stored in a redundancy memory, each entry comprising a respective vector sequence and coded length of the vector sequence;

in accordance with received one or more data words, fetching respective vector sequences and the coded lengths thereof from the redundancy memory; and generating testing data by processing the respective vector sequences and the coded lengths thereof in association with the one or more data words received from the buffer memory, whereby the redundancy memory behaves like a dictionary.

4. The method as recited in claim 3, wherein said generating step modifies a retrieved vector sequence in accord with a received instruction.

\* \* \* \* \*